(12) United States Patent
Suzuki et al.

(10) Patent No.: US 8,513,756 B2
(45) Date of Patent: Aug. 20, 2013

(54) SEMICONDUCTOR PACKAGE AND MANUFACTURING METHOD FOR A SEMICONDUCTOR PACKAGE AS WELL AS OPTICAL MODULE

(75) Inventors: Masami Suzuki, Kanagawa (JP); Masayuki Nagao, Kanagawa (JP); Yasuyuki Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 13/186,625

(22) Filed: Jul. 20, 2011

(65) Prior Publication Data

US 2012/0056292 A1 Mar. 8, 2012

(30) Foreign Application Priority Data

Sep. 7, 2010 (JP) ................................ P2010-200067

(51) Int. Cl.
*H01L 21/28* (2006.01)
(52) U.S. Cl.
USPC .......................................... 257/432; 257/659

(58) Field of Classification Search
USPC .................. 257/432, 659, E23.114, E21.158, 257/E31.127
See application file for complete search history.

(56) References Cited

U.S. PATENT DOCUMENTS 7,925,154 B2 * 4/2011 Ryu .............................. 396/268
2009/0166685 A1 7/2009 Hokazono

* cited by examiner

*Primary Examiner* — Roy Potter
(74) *Attorney, Agent, or Firm* — Oblon, Spivak, McClelland, Maier & Neustadt, L.L.P.

(57) ABSTRACT

A semiconductor package includes: a supporting substrate; a functioning element and a first joining element formed on a first principal surface of the supporting substrate; a sealing substrate disposed in an opposing relationship to the supporting substrate with the functioning element and the first joining element interposed therebetween; a second joining element provided on a second principal surface of the supporting substrate; a through-electrode provided in and extending through the supporting substrate and adapted to electrically connect the first and second joining elements; and a first electromagnetic shield film coated in an overall area of a side face of the supporting substrate which extends perpendicularly to the first and second principal surfaces.

12 Claims, 13 Drawing Sheets

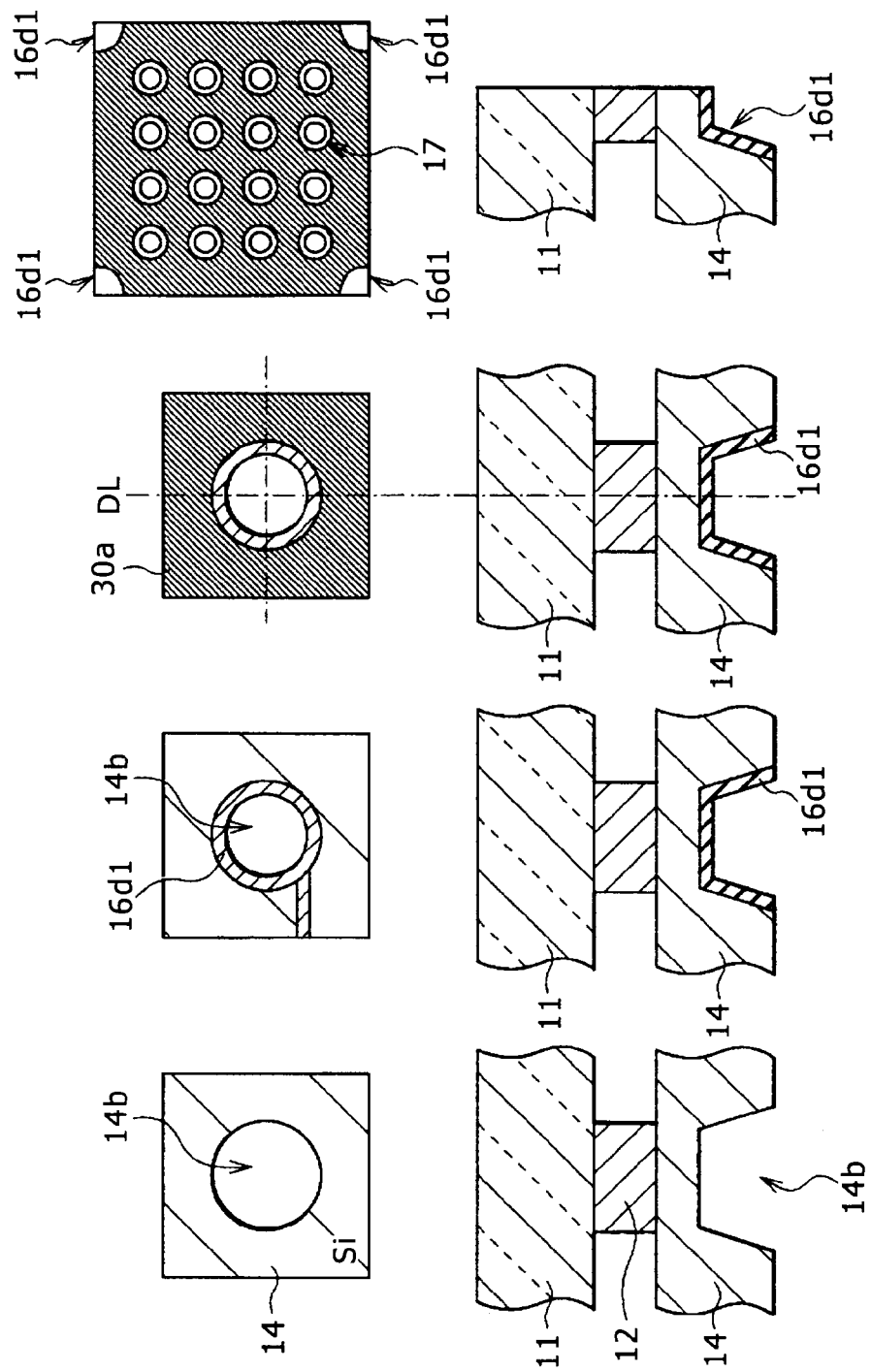

SEMICONDUCTOR PACKAGE AND MANUFACTURING METHOD FOR A SEMICONDUCTOR PACKAGE AS WELL AS OPTICAL MODULE

BACKGROUND

The present disclosed technology relates to a semiconductor package such as a WCSP (wafer level chip size package) and a WLCM (wafer level camera module) which uses a semiconductor package.

Together with enhancement of the integration technique in recent years, reduction in size and weight, reduction in voltage for operation and reduction in power consumption and increase in frequency for operation of electronic apparatus have advanced rapidly. Thus, demands for area array type packages such as a BGA (ball grid array), a LGA (land grid array) and a CSP (chip size package) are increasing. Recently, also an advanced technology such as a WCSP which utilizes a through-electrode begins to be popularized.

A WCSP is a semiconductor package formed by carrying out a formation processing step of sealing resin or external terminals at a stage of a wafer before dicing. With such a WCSP as just described, when a chip is mounted on a printed board such as a mother board, pads on the chip and pads on the printed board can be joined together through solder balls. This eliminates the necessity for connection to a bonding wire or an interposer. The WCSP is used suitably as an electronic part package, for example, for a light reception element or a MEMS (Micro Electro Mechanical System: micromachine) element.

However, it is necessary for such a semiconductor package as the above-described WCSP to assure EMC (Electromagnetic Compatibility: electromagnetic noninterference) with a printed board, and various countermeasures have been taken. For example, a method is disclosed in Japanese Patent Laid-Open No. 2009-158853 (hereinafter referred to as Patent Document 1) that an electromagnetic shield formed from a metal sheet or the like is disposed on an outer periphery of a semiconductor package which utilizes a through-electrode.

SUMMARY

However, such a method as disclosed in Patent Document 1 includes a process of working a metal sheet, for example, in response to a chip size to form an enclosure and fitting a chip in position into the enclosure or laminating the worked metal sheet to an outer periphery of the chip. Therefore, the method has a problem that the number of processing steps or the cost increases.

Therefore, it is desirable to provide a semiconductor package which can maintain good EMC with a printed board and can be manufactured at a low cost by a simple and easy process, a manufacturing method for the semiconductor package, and an optical module which incorporates the semiconductor package.

According to an embodiment of the disclosed technology, there is provided a semiconductor package including a supporting substrate, a functioning element and a first joining element formed on a first principal surface of the supporting substrate, a sealing substrate disposed in an opposing relationship to the supporting substrate with the functioning element and the first joining element interposed therebetween, a second joining element provided on a second principal surface of the supporting substrate, a through-electrode provided in and extending through the supporting substrate and adapted to electrically connect the first and second joining elements, and a first electromagnetic shield film coated in an overall area of a side face of the supporting substrate which extends perpendicularly to the first and second principal surfaces.

According to another embodiment of the disclosed technology, there is provided a manufacturing method for a semiconductor package, including laminating a sealing substrate to a supporting substrate having a first principal surface on which a functioning element and a first joining element are provided, forming a through-electrode in a region of the supporting substrate which corresponds to the first joining element, forming a second joining element electrically connected to the through-electrode on a second principal surface side of the supporting substrate, and spreading a conductive material to an overall area of a side face of the first supporting substrate which extends perpendicularly to the first and second principal surfaces to form a first electromagnetic shield film.

According to a further embodiment of the disclosed technology, there is provided an optical module including a supporting substrate, a light reception element and a first joining element formed on a first principal surface of the supporting substrate, a sealing substrate disposed in an opposing relationship to the supporting substrate with the light reception element and the first joining element interposed therebetween, a second joining element provided on a second principal surface of the supporting substrate, a through-electrode provided in and extending through the supporting substrate and adapted to electrically connect the first and second joining elements, a lens unit provided on the sealing substrate, and a first electromagnetic shield film coated in an overall area of a side face of the supporting substrate which extends perpendicularly to the first and second principal surfaces.

In the semiconductor package, manufacturing method for a semiconductor package and optical module of the disclosed technology, the first and second joining elements formed on the two different principal surfaces of the supporting substrate are electrically connected to each other through the through-electrode. Further, the external connection terminal is led out from the first principal surface side to the second principal surface side of the supporting substrate. A conductive material is spread to the overall area of the side face of such a semiconductor package or optical module as described above to form the first electromagnetic shield film. The first electromagnetic shield film suppresses otherwise possible occurrence of electromagnetic interference between the semiconductor package or optical module and, for example, a printed board on which the semiconductor package or optical module is mounted.

With the semiconductor package, manufacturing method for a semiconductor package and optical module, the first and second joining elements formed on the different principal surfaces of the supporting substrate are electrically connected to each other through the through-electrode, and the first electromagnetic shield film is formed by spreading conductive material to the overall area of the side face of the semiconductor package or optical module. Since the first electromagnetic shield film is formed by spreading in this manner, the number of steps can be reduced and the cost can be reduced in comparison with those in an alternative case in which a metal sheet or the like is worked to form an electromagnetic shield. Therefore, good EMC of the semiconductor package or optical module with a printed board can be maintained at a low cost by a simple and easy process.

The above and other features and advantages of the disclosed technology will become apparent from the following description and the appended claims, taken in conjunction with the accompanying drawings in which like parts or elements denoted by like reference characters.

BRIEF DESCRIPTION OF THE DRAWINGS

FIGS. 15A to 15D are plan views and sectional views illustrating successive steps of a wiring line layer formation process according to a modification to the embodiment.

DETAILED DESCRIPTION OF THE PREFERRED EMBODIMENT

In the following, a preferred embodiment of the disclosed technology is described in detail with reference to the accompanying drawings. It is to be noted that the description is given in the following order.
1. Embodiment (example of a camera module having an electromagnetic light blocking shield film formed on a side face and a rear face thereof)
2. Modification (another example of a wiring line layer formation step)

Embodiment

General Configuration of the Camera Module 1

Figure 1:
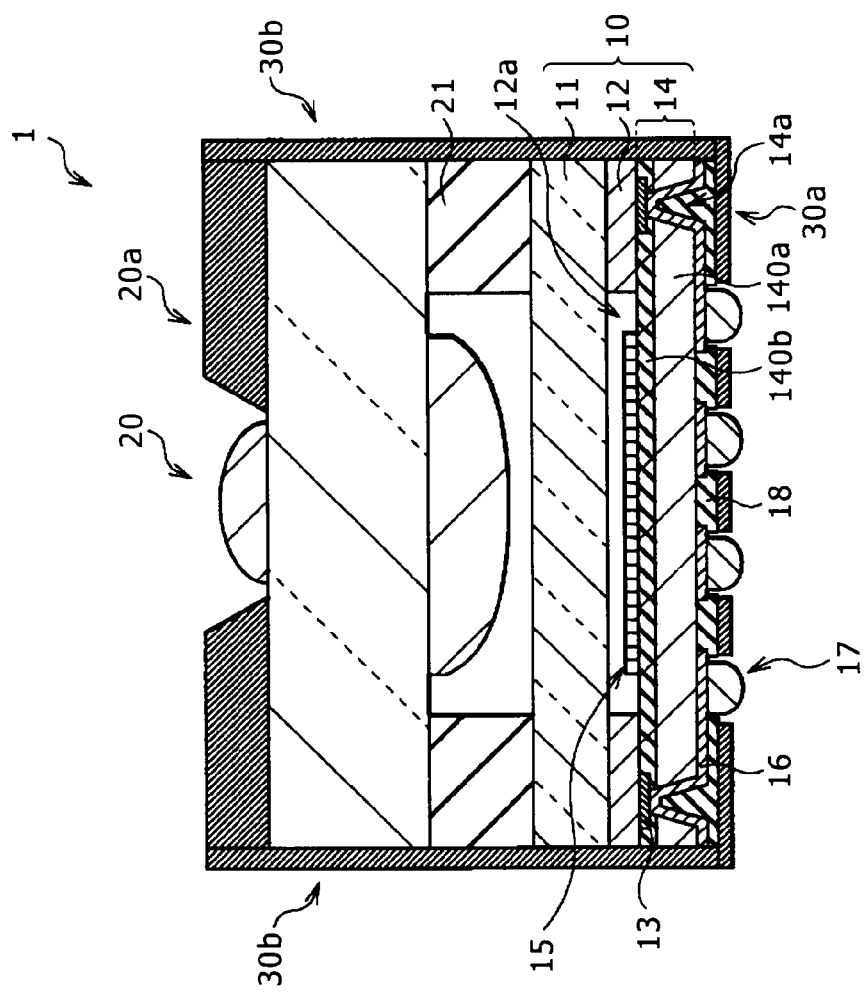
FIG. 1 is a sectional view showing a general configuration of a WLCM according to an embodiment of the disclosed technology.

FIG. 1 shows a cross sectional configuration of a camera module 1 which is an optical module according to an embodiment of the disclosed technique. Referring to FIG. 1, the camera module 1 is used with an optical apparatus such as, for example, an image sensor apparatus and includes a lens unit 20 incorporated in a wafer level package 10 which is a semiconductor package. The camera module 1 is mounted at a lower face side thereof, that is, at the wafer level package 10 side thereof, on a printed board such as a mother board and admits light from the upper face side thereof, that is, from the lens unit 20 side thereof, to receive the light.

The wafer level package 10 is a WCSP (wafer level chip size package) wherein, for example, a light reception element 15 is sealed between a supporting substrate 14 and a glass substrate 11 which serves as a sealing substrate. The supporting substrate 14 and the glass substrate 11 are laminated at peripheral edge portions thereof to each other through an adhesive layer 12. A region surrounded by the supporting substrate 14, glass substrate 11 and adhesive layer 12 forms a cavity 12a for sealing the light reception element 15 airtight.

The supporting substrate 14 is a substrate for supporting the light reception element 15 and so forth and includes a SiO$_2$ layer 140b formed, for example, on a silicon substrate 140a. The supporting substrate 14 has a front face, that is, a first principal surface, and a rear face, that is, a second principal surface, which are structured in the following manner.
Structure of the Front Face Side of the Supporting Substrate 14

Figure 2A:
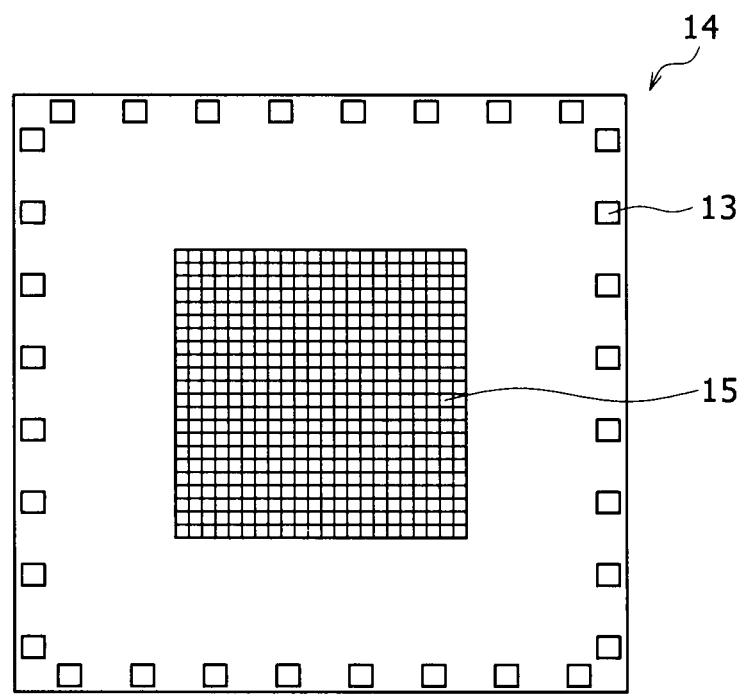
FIGS. 2A and 2B are schematic plan views showing a general configuration of a front face and a rear face of a silicon substrate of the WLCM shown in FIG. 1.

On the front face or first principal surface of the supporting substrate 14, the light reception element 15 is provided in an opposing relationship to the cavity 12a and a plurality of electrode pads 13, which are first joining elements, disposed in an opposing relationship to the adhesive layer 12. FIG. 2A illustrates an example of a planar configuration of the front face of the supporting substrate 14. Referring to FIG. 2A, in the example shown, the light reception element 15 is provided at a location in the proximity of the center of the front face of the supporting substrate 14 having a square shape, and the electrode pads 13 are disposed on a periphery of the supporting substrate 14, that is, along the peripheral edge of the supporting substrate 14. It is to be noted that peripheral circuits not shown are formed in a region between the light reception element 15 and the electrode pads 13.

The electrode pads 13 are connected to the light reception element 15 and the peripheral circuits by wiring lines not shown and used for external connection to input electric signals to the light reception element 15 and the peripheral circuits and extract electric signals outputted from the light reception element 15 and the peripheral circuits. The electrode pads 13 are formed, for example, from aluminum (Al).

The light reception element 15 is a solid-state image pickup element such as, for example, a CCD (Charge Coupled Device) element or a CMOS (Complementary Metal Oxide Semiconductor) element. A color filter not shown is provided on the light receiving face of the light reception element 15. In the light reception element 15, exposure to light and reading out of a received light signal are carried out in response to an electric signal inputted thereto through the electrode pads 13, and the read out light receiving signal is outputted to the outside through the electrode pads 13.
Structure of the Rear Face Side or Printed Board Joining Side of the Supporting Substrate 14

Figure 2B:
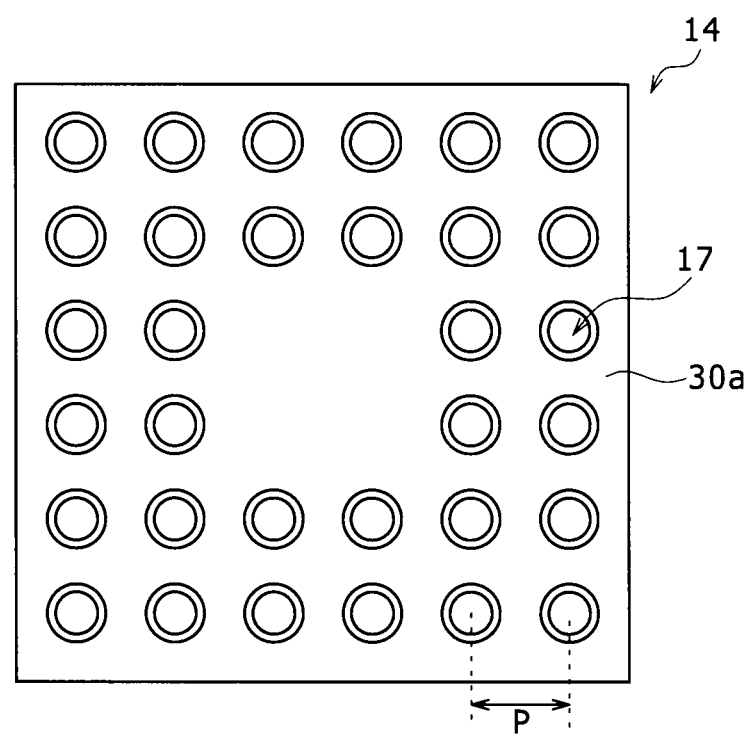

On the rear face side, that is, on the second principal surface side, of the supporting substrate 14 having such a configuration as described above, a plurality of solder balls 17, which are second joining elements, are disposed. Further, a sealing resin layer 18 and an electromagnetic light blocking shield film or second electromagnetic shield film 30a having openings corresponding to the solder balls 17 are formed. FIG. 2B illustrates an example of a planar configuration of the rear face of the supporting substrate 14. Referring to FIG. 2B, in the example illustrated, a plurality of solder balls 17 are arrayed regularly in a predetermined pitch P on the rear face of the square shape of the supporting substrate 14. The array of the solder balls 17 is set suitably in response to the position of joining pads on the printed board (not shown) side to be mounted. Consequently, the array of the electrode pads 13 is converted into that of the solder balls 17, and they can be mounted directly on a printed board such as a mother board. It is to be noted here that, although the solder balls 17 according to the array are not formed in the proximity of the center of the rear face of the supporting substrate 14, the solder balls 17 may otherwise be disposed in the proximity of the center or else be disposed only in a peripheral region of the rear face of the supporting substrate 14.

The solder balls 17 function as external connection terminals for being mounted on a printed board and are formed from leadless high-melting point solder such as, for example, Sn—Ag—Cu. The solder balls 17 are formed such that they project from the electromagnetic light blocking shield film 30a on the rear face side of the supporting substrate 14 and are electrically connected to the electrode pads 13 through a re-wiring line layer 16 hereinafter described.

The sealing resin layer 18 is made of, for example, an epoxy-based, polyimide-based, silicon-based or acrylic-based resin material or the like and protects the re-wiring line layer 16. The sealing resin layer 18 has an opening having a diameter greater than the electromagnetic light blocking shield film 30a.

The electromagnetic light blocking shield film 30a is formed from a material having, for example, conductivity (for example, the resistance value is lower than $10^4 \Omega$) and a light blocking property such as, for example, carbon black. The diameter of the opening of the electromagnetic light blocking shield film 30a is set smaller than the diameter of a solder land 16c hereinafter described of the re-wiring line layer 16, and the thickness of the electromagnetic light blocking shield film 30a is set suitably to such a degree that it does not exceed the thickness of the solder balls 17. It is to be noted here that, although the electromagnetic light blocking shield film 30a has not only conductivity but also a light blocking property, if the electromagnetic light blocking shield film 30a at least has conductivity, then it can exhibit a function as an electromagnetic shield.

The supporting substrate 14 has a through-via 14a provided at a position thereof corresponding to an electrode pad 13 and serving as a first through-hole. The through-via 14a extends from the front face to the rear face of the supporting substrate 14 through the supporting substrate 14 such that the electrode pad 13 is partly exposed to the rear face side. A portion of the re-wiring line layer 16 which is a wiring line layer is formed in the inside of the through-via 14a such that it covers the surface of the exposed electrode pad 13. Further, the re-wiring line layer 16 extends or is led out from the inside of the through-via 14a to a formation region of a solder ball 17 on the front face of the supporting substrate 14. The through-via 14a and the re-wiring line layer 16 correspond to a particular example of the through-electrode in the disclosed technology. It is to be noted that an insulating film 141 and a seed layer 142 not shown in FIG. 1 and hereinafter described are formed between the rear face of the supporting substrate 14 and the re-wiring line layer 16.

The re-wiring line layer 16 is formed from a metal material such as, for example, copper (Cu), aluminum, tungsten (W), titanium (Ti), gold (Au), nickel (Ni), silver (Ag), Molybdenum (Mo) or TiW. Although details are hereinafter described, the re-wiring line layer 16 includes a pad connecting portion 16a which covers the inside of the through-via 14a, a solder land 16c serving as a formation region of the solder ball 17, and a leader wiring line portion 16b interconnecting the pad connecting portion 16a and the solder land 16c.

To the glass substrate 11 of the wafer level package 10 having such a structure as described above, the lens unit 20 is laminated with an adhesive layer 21 interposed therebetween. A light blocking film 20a is formed in a predetermined pattern on the upper face of the lens unit 20.

The lens unit 20 includes a fixed-focus lens or a variable-focus lens of a popular type and has a function of condensing an incident light beam to the light reception element 15. The light blocking film 20a allows only a light beam from a desired direction to be selectively introduced to the lens unit 20 and the light reception element 15 and is configured, for example, from chromium.

An electromagnetic light blocking shield film 30b, which is a first electromagnetic shield film, is coated over an overall area of a side face of the camera module 1 having such a configuration as described hereinabove, that is, over a side face perpendicular to the front face and the rear face of the supporting substrate 14. The electromagnetic light blocking shield film 30b is configured from a material having, for example, conductivity and a light blocking property similarly to the electromagnetic light blocking shield film 30a and has a thickness of, for example, 5 to 30 µm. This electromagnetic light blocking shield film 30b is formed by directly applying the material mentioned hereinabove to the side face as hereinafter described. The electromagnetic light blocking shield films 30a and 30b are preferably connected to each other, that is, electrically connected to each other, on the rear face side of the supporting substrate 14.

Manufacturing Method of the Camera Module 1

Such a camera module 1 as described above can be manufactured, for example, in such a manner as described below. FIGS. 3A to 14B illustrate a manufacturing process of the camera module 1.

1. Wafer Lamination Step

Figure 3A:
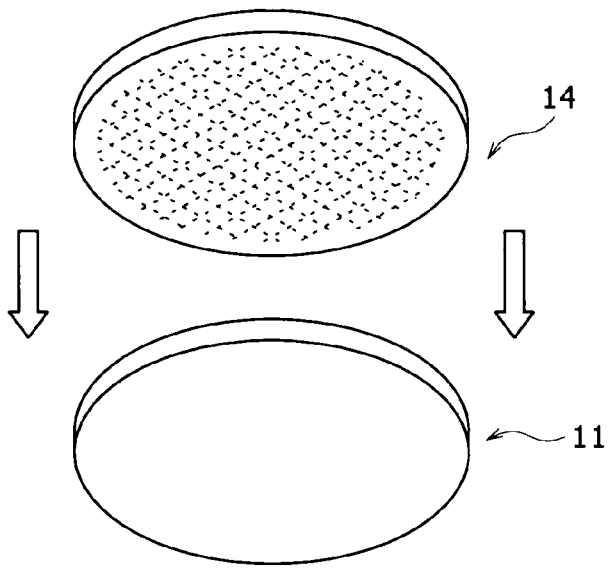
FIGS. 3A to 3C, 4A to 4D, 5A to 5C and 6A to 6D are schematic sectional views illustrating successive steps of a manufacturing process of the WLCM shown in FIG. 1.
Figure 3B:
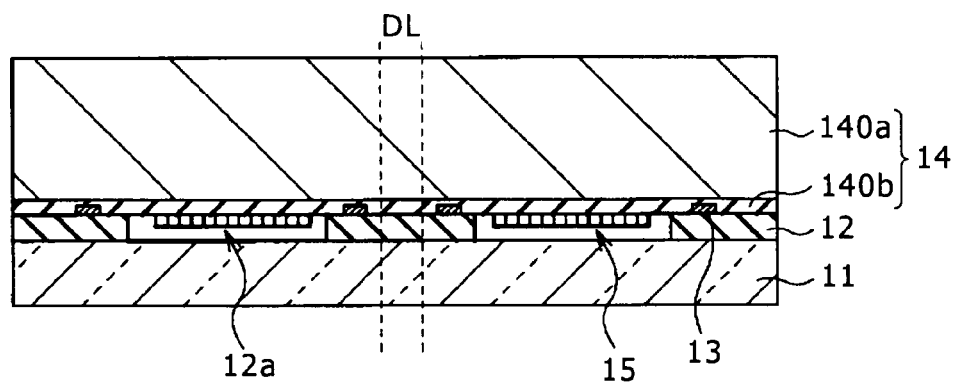

First, a supporting substrate or wafer 14 on the front face of which a light reception element 15, electrode pads 13 and peripheral circuits not shown are formed for each chip and a glass substrate 11 are prepared. Then, the supporting substrate 14 and the glass substrate 11 are laminated to each other through an adhesive layer 12 as seen in FIGS. 3A and 3B. Thereupon, the adhesive layer 12 is formed in a region other than the formation region of the light reception element 15 on the front face of the supporting substrate 14, that is, a region along a dicing line DL, to seal the light reception element 15 in the cavity 12a.

Figure 3C:
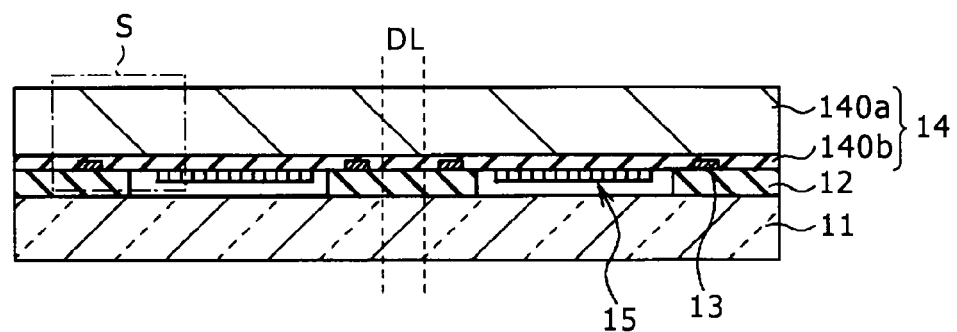

Then, the rear face of the supporting substrate 14, that is, the silicon substrate 140a, is planed to make the silicon substrate 140a thin as seen in FIG. 3C. It is to be noted that, in FIGS. 3B and 3C, only a sectional configuration of part of the wafer is shown for simplified illustration.

Then, for the supporting substrate 14 sealed with the glass substrate 11 in such a manner as described above, steps for through-via formation, insulating film and seed layer formation, re-wiring line formation, sealing resin layer formation and solder ball formation are carried out in this order on the wafer level, that is, on the stage before cutting out by dicing. The sectional views of FIGS. 4A to 10 illustrating the steps mentioned show only the portion corresponding to the region S in FIG. 3C. Further, the supporting substrate 14 is shown such that the rear face side thereof is directed upwardly and the front face side thereof is directed downwardly.

2. Through-Via Formation Step

Figure 4A:
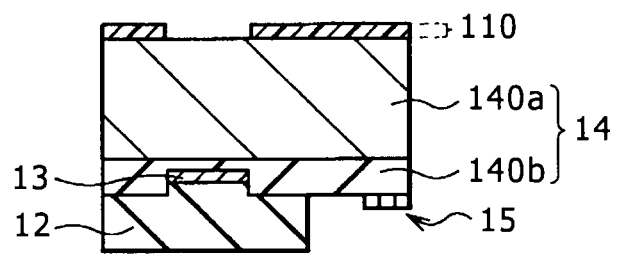
Figure 4B:
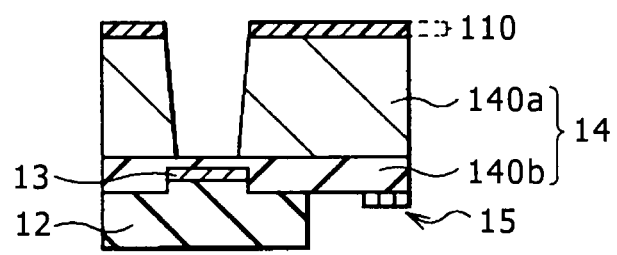
Figure 4C:
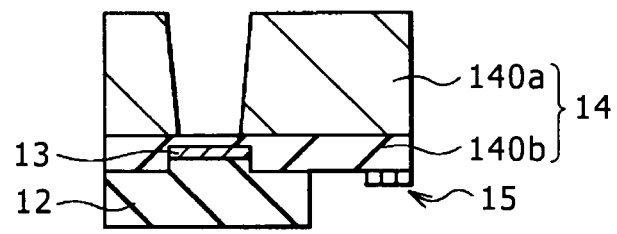
Figure 14A:
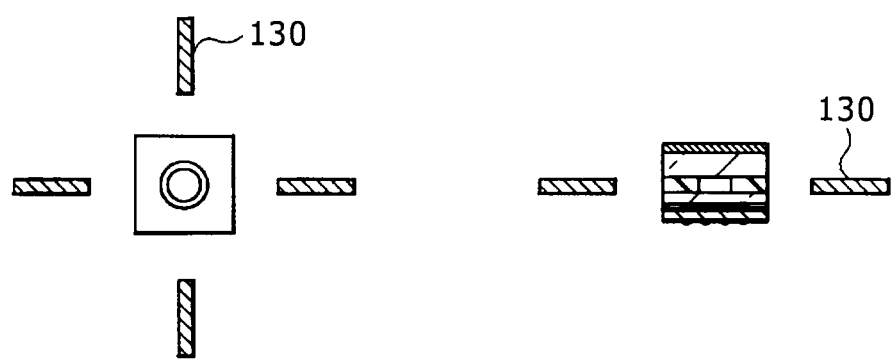
FIGS. 14A and 14B are schematic views illustrating a step following the step illustrated in FIG. 13.
Figure 14B:
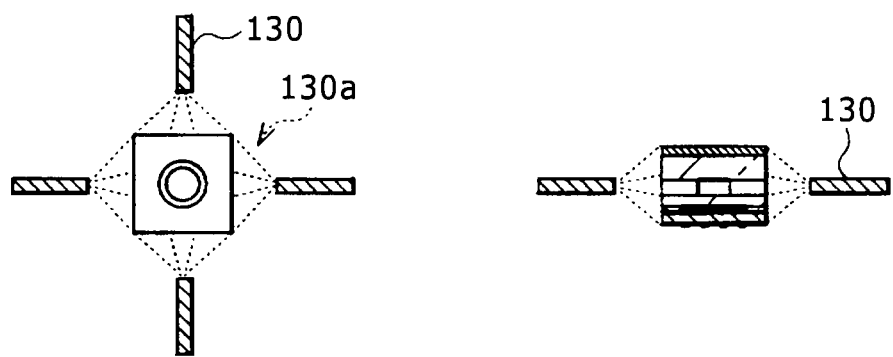

First, a photoresist film 110 is formed on the rear face of the supporting substrate 14 and then openings are formed by patterning at positions of the photoresist film 110 opposing to the electrode pads 13 as seen in FIG. 4A. Then, the silicon substrate 140a of the supporting substrate 14 only in the regions corresponding to the electrode pads 13 is selectively removed as seen in FIG. 14B, for example, by RIE (Reactive Ion Etching). Thereafter, the photoresist film 110 is exfoliated from the rear face of the supporting substrate 14 as seen in FIG. 4C. Consequently, the $SiO_2$ layer 140b is exposed to the rear face side of the supporting substrate 14.

Figure 4D:
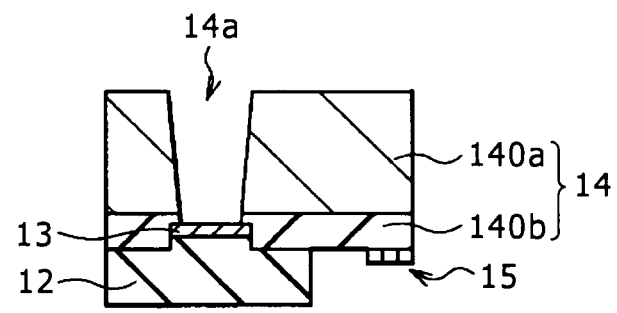

Thereafter, the exposed $SiO_2$ layer 140b is etched to the front face of the electrode pads 13 as seen in FIG. 4D, for example, by RIE. Consequently, a through-via 14a which extends from the rear face to the front face of the supporting substrate 14 is formed at a position corresponding to each electrode pad 13. In other words, the electrode pad 13 is exposed to the rear face side of the supporting substrate 14.

3. Insulating Film and Seed Layer Formation Step

Figure 5A:
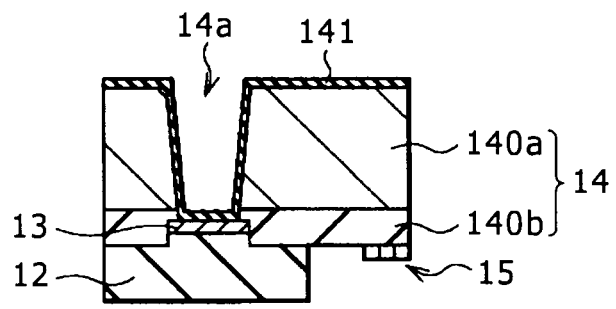
Figure 5B:
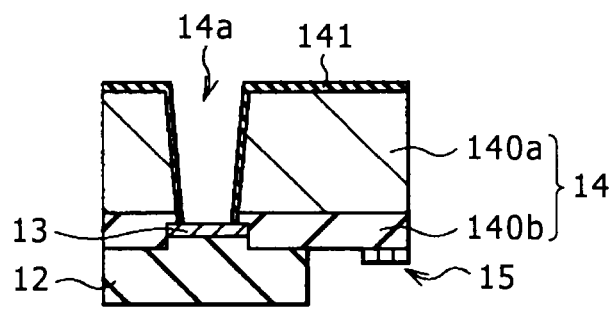

Then, an insulating film 141 made of, for example, $SiO_2$ is formed over an overall area of the rear face of the supporting substrate 14, in which the through-via 14a are formed, as seen in FIG. 5A, for example, by CVD (Chemical Vapor Deposition). Thereafter, the bottom of the through-via 14a of the insulating film 141 is selectively removed so as to expose the front face of the electrode pad 13 as seen in FIG. 5B, for example, by photolithography.

Figure 5C:
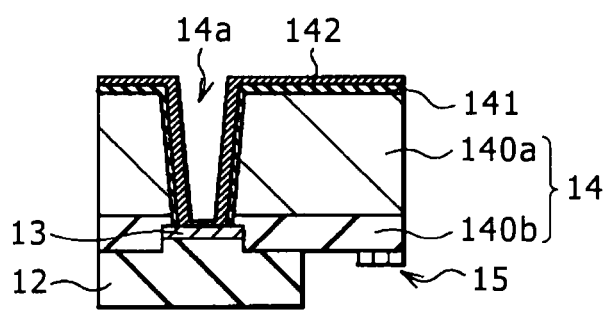

Thereafter, a seed layer 142 made of, for example, copper is formed in such a manner as to cover the insulating film 141 and the exposed electrode pads 13 as seen in FIG. 5C, for example, by sputtering.

4. Re-Wiring Line Layer Formation Step

Figure 6A:
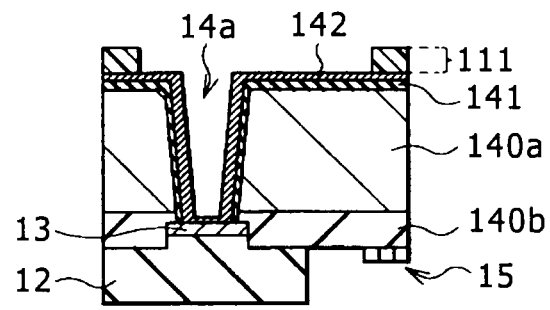
Figure 6B:
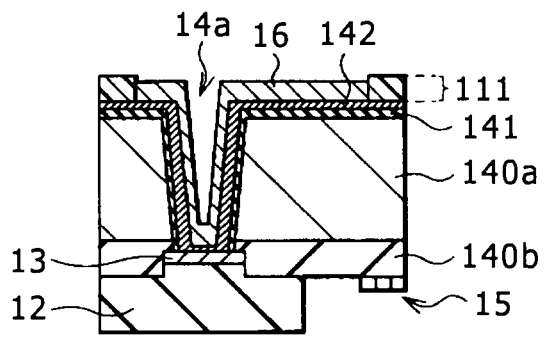

Thereafter, a re-wiring line layer 16 is formed continuously or stretched from a position on each electrode pad 13 to a predetermined region, that is, a formation region of a solder ball 17, on the rear face side of the supporting substrate 14 through the through-via 14a. In particular, a photoresist film 111 is formed on the seed layer 142 as described above as seen in FIG. 6A and patterning is carried out to form an opening corresponding to the formation region of the re-wiring line layer 16, that is, in the pad connecting portion 16a, leader wiring line portion 16b and solder land 16c not shown in FIGS. 6A to 6D. Thereafter, a re-wiring line layer 16 made of any of the materials described hereinabove is formed at the opening portion of the photoresist film 111 on the seed layer 142, for example, by electroplating as seen in FIG. 6B.

Figure 6C:
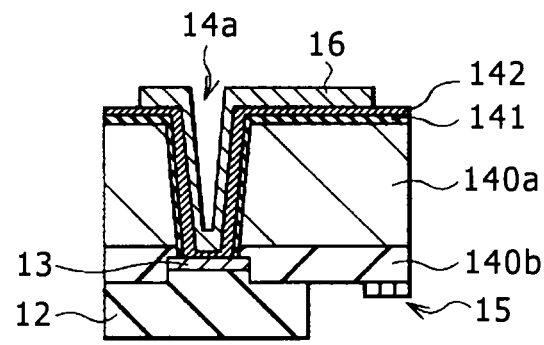
Figure 6D:
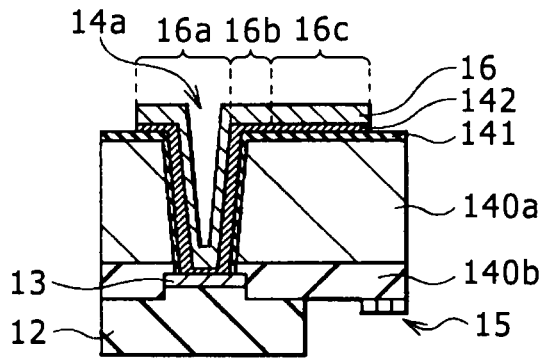

Then, the photoresist film 111 is exfoliated as seen in FIG. 6C, and then the seed layer 142 exposed to the rear face side of the supporting substrate 14 is removed as seen in FIG. 6D, for example, by wet washing. The re-wiring line layer 16 is formed on the rear face side of the supporting substrate 14 in this manner.

Figure 7A:
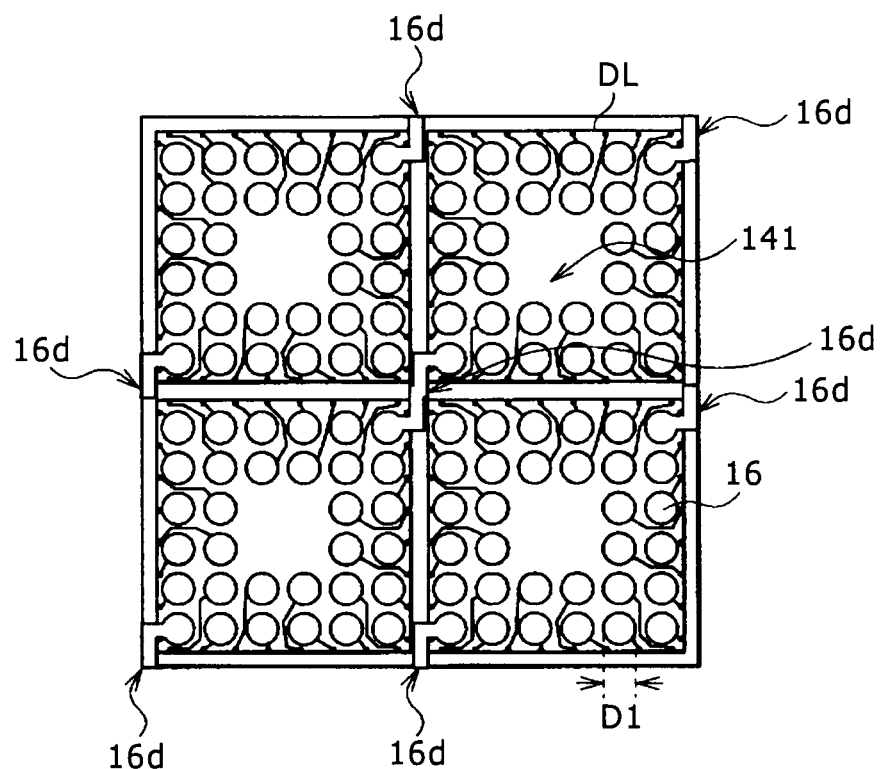
FIGS. 7A and 7B are plan views showing a configuration of the rear face of the silicon substrate after the step illustrated in FIG. 6D.
Figure 7B:
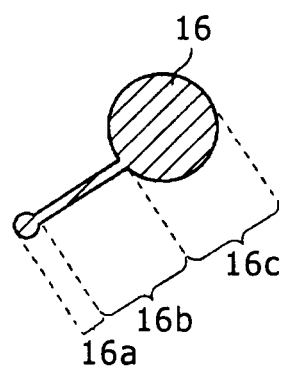

A configuration of the rear face side of the supporting substrate 14 on which the re-wiring line layer 16 is formed is schematically shown in FIG. 7A. It is to be noted that, for simplified illustration, only regions corresponding to four chips positioned adjacent each other are shown. Meanwhile, FIG. 7B shows an enlarged form of a re-wiring line layer 16. In this manner, at the re-wiring line layer formation step, particularly a pad connecting portion 16a is formed at a position opposing to a through-via 14a, that is, an electrode pad 13, and a solder land 16c is formed at a position opposing to a solder ball 17. Further, a leader wiring line portion 16b for connecting the pad connecting portion 16a and the solder land 16c to each other is formed. The solder land 16c is formed at a position set in response to the array of joining pads on the printed board and so forth. The leader wiring line portion 16b makes it possible for the solder balls 17 to be formed in an array different from that of the electrode pads 13. Consequently, terminals for external connection are converted from the electrode pads on the front face side of the supporting substrate 14 to the solder balls 17 on the rear face side of the supporting substrate 14, and direct mounting on a printed board using the solder balls 17 becomes possible.

Further, while a plural number of such re-wiring line layer 16 corresponding to the number of electrode pads 13 and solder balls 17 are formed, some of the re-wiring line layers 16 are formed such that they are connected to each other between adjacent ones of the chips. For example, at a corner portion of each chip, a portion by which different re-wiring line layers 16 are connected to each other, that is, a shield connection portion 16d, is formed. Consequently, when each chip is cut out at a dicing step hereinafter described, the shield connection portion 16d can be exposed to a side face of the chip, and consequently, electric connection between the shield connection portion 16d and the electromagnetic light blocking shield film 30b formed on the side face at a later step can be established.

5. Sealing Resin Layer Formation Step

Figure 8A:
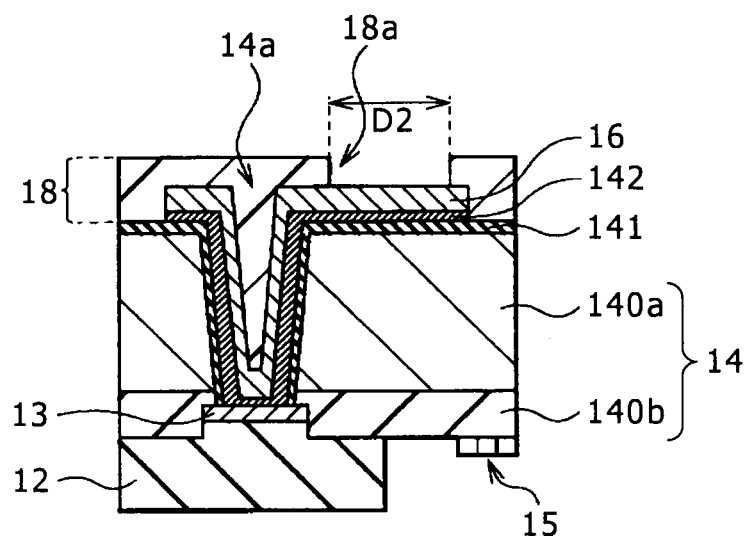
FIGS. 8A and 8B, and 9A and 9B are sectional views and plan views, respectively, illustrating successive steps following the step illustrated in FIG. 6D.
Figure 8B:
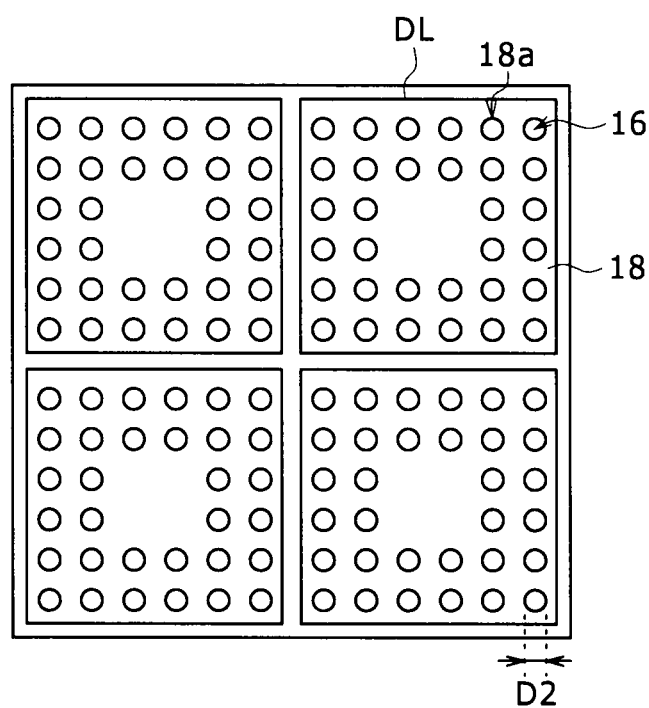

Then, a sealing resin layer 18 is spread and formed over an overall area of the rear face of the supporting substrate 14, and an opening 18a is formed in a region of the re-wiring line layer 16 opposed to the solder land 16c, for example, by photolithography as seen in FIGS. 8A and 8B. The diameter D2 of the opening 18a is set, for example, smaller than that of an opening a1 in the electromagnetic light blocking shield film 30a hereinafter described.

6. Formation Step of the Electromagnetic Light Blocking Shield Film 30a (Lower Face)

Figure 9A:
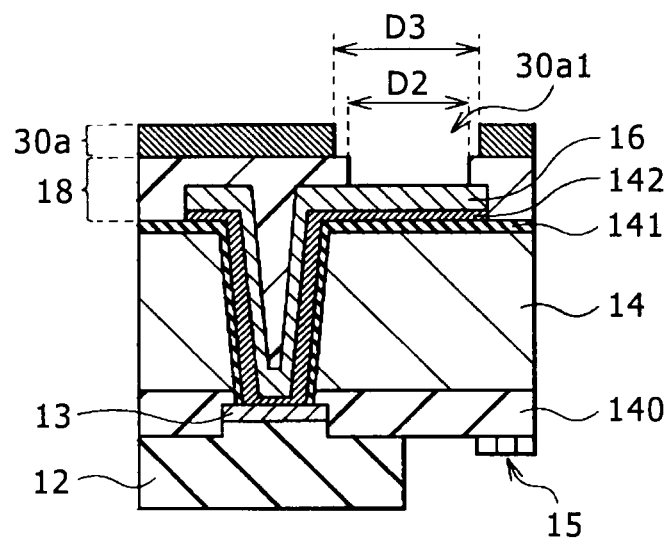
Figure 9B:
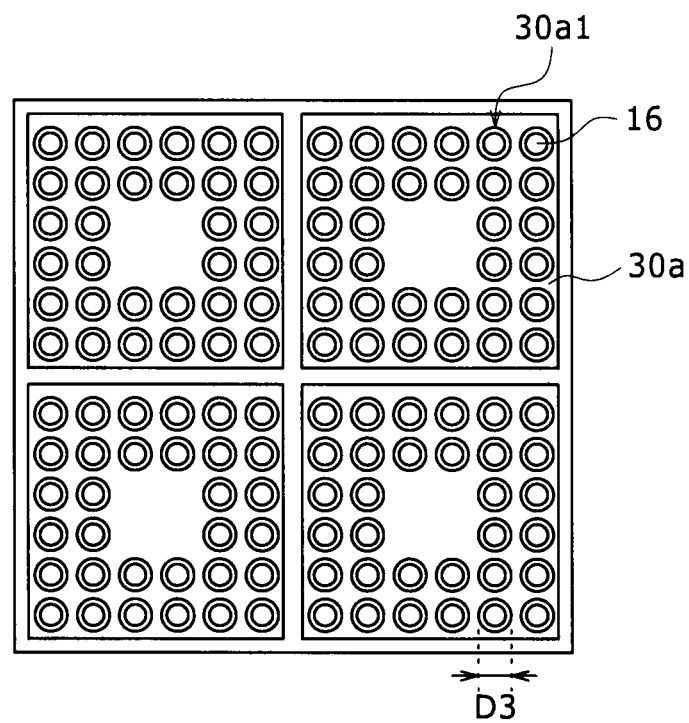
Figure 10:
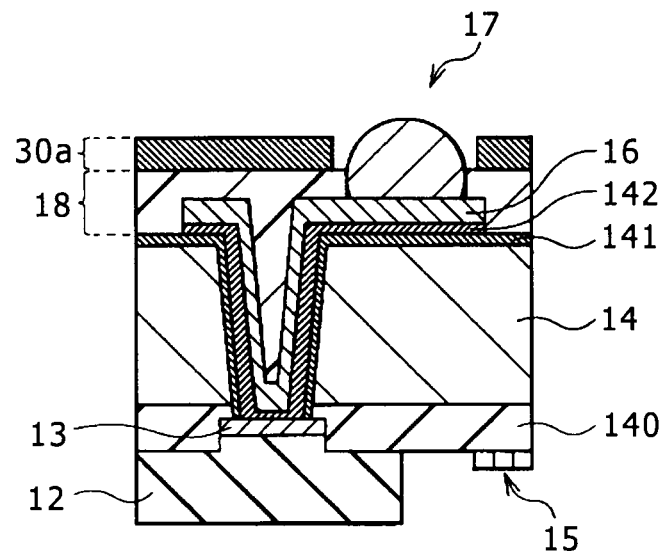
FIGS. 10 and 11 are a sectional view and a plan view, respectively, illustrating successive steps following the step illustrated in FIGS. 9A and 9B.

Thereafter, an electromagnetic light blocking shield film 30a made of any of the materials described hereinabove is formed over an overall area of the sealing resin layer 18, and an opening 31a is formed in a region of the electromagnetic light blocking shield film 30a corresponding to the solder land 16c and the opening 18a of the sealing resin layer 18 by photolithography as seen in FIGS. 9A and 9B. Thereupon, the diameter D3 of the opening 31a is set greater by approximately several tens μm than the diameter D2 of the opening 18a of the sealing resin layer 18 so that the solder ball 17 may not contact therewith. However, preferably the diameter D3 of the opening 31a is set smaller than the diameter D1 of the solder land 16c of the re-wiring line layer 16. This is because, if the diameter D3 of the opening 31a1 is greater than the diameter D1 of the solder land 16c, then leakage of light from a peripheral region of the solder ball 17 to the printed board side occurs.

7. Solder Ball Formation Step

Then, solder balls 17 are formed in regions of the solder lands 16c of the re-wiring line layer 16 which are exposed through the openings 18a of the sealing resin layer 18 and the openings 30a1 of the electromagnetic light blocking shield film 30a.

8. Dicing Step

Figure 11:
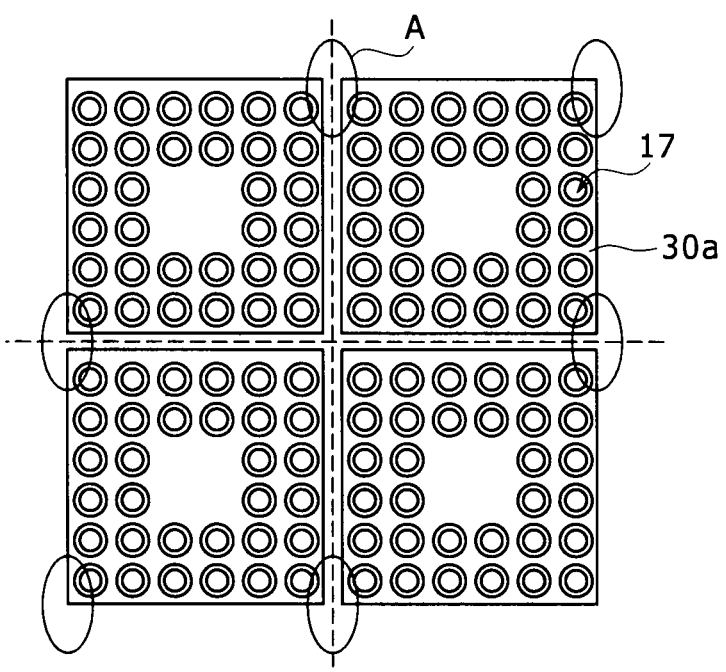
Figure 12:
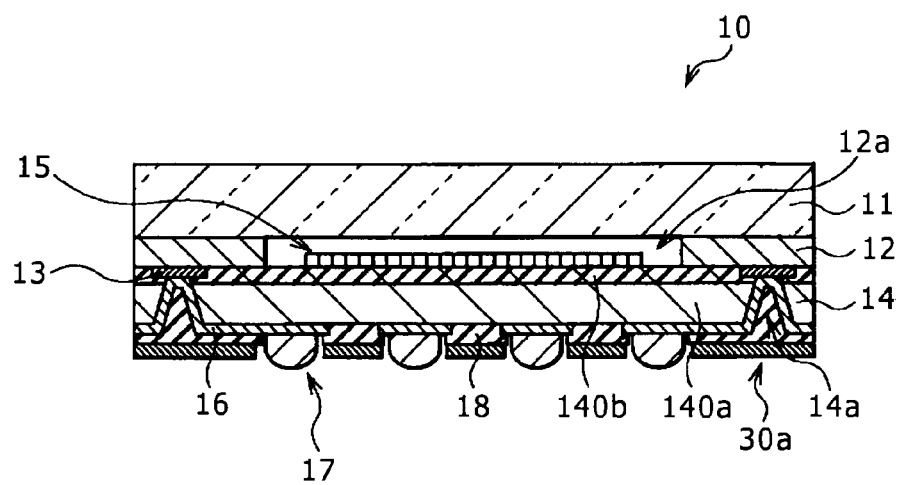
FIG. 12 is a sectional view of a WCSP formed by the step illustrated in FIG. 11.

Then, after the solder balls 17 are formed on the supporting substrate 14 on the wafer level, the chips are cut out along the dicing lines DL by dicing as seen in FIG. 11. Consequently, a shield connection portion 16d formed for connection between adjacent ones of the chips at the re-wiring line layer formation step is exposed to a side face of each chip. More particularly, a shield connection portion 16d is exposed at a corner portion A of each chip. Wafer level packages 10 are formed in this manner as seen in FIG. 12.

9. Lens Unit Joining Step

Figure 13:
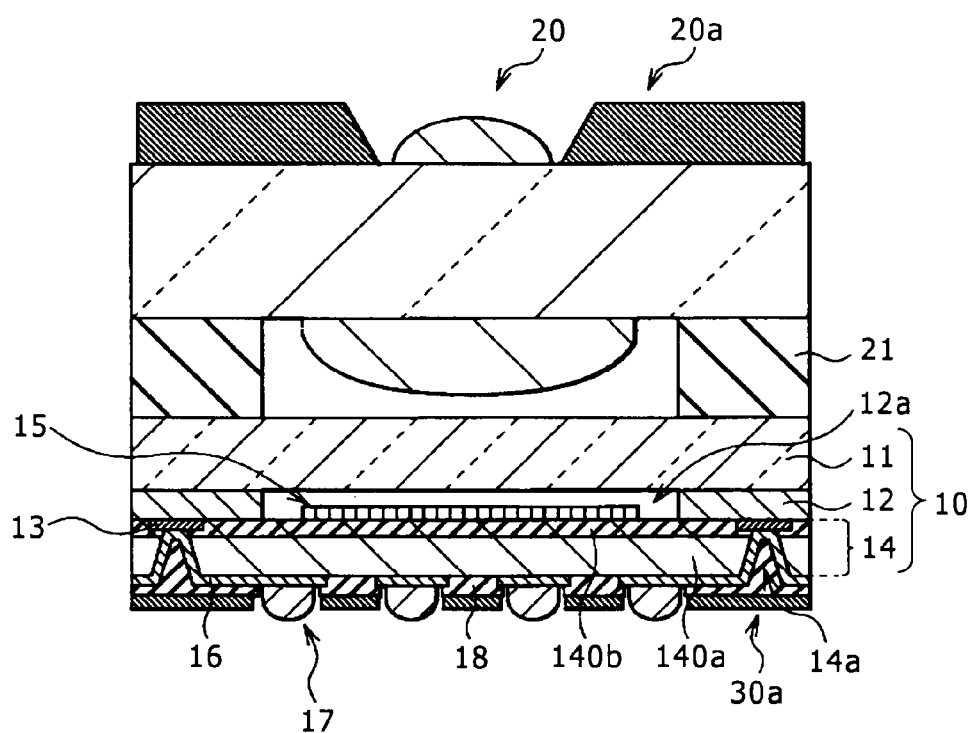
FIG. 13 is a sectional view illustrating a step following the step illustrated in FIG. 11.

Thereafter, for each chip, that is, for each wafer level package 10, a lens unit 20 is laminated to the glass substrate 11 through an adhesive layer 21 as seen in FIG. 13. For the convenience of description, a wafer level package 10 to which the lens unit 20 is laminated is hereinafter referred to as joined body.

10. Formation Step of the Electromagnetic Light Blocking Shield Film 30b (Side Face)

Finally, an electromagnetic light blocking shield film 30b made of the material described hereinabove such as, for example, carbon black is formed over an overall area of the side face of the joined body formed in such a manner as described above by spraying or spreading using, for example, a spreading apparatus. Thereupon, the joined body is placed in the spreading apparatus in which four nozzles 130 for spraying are provided along different directions perpendicular to each other, for example, as seen in FIG. 14A. Thereafter, carbon black 130a is sprayed to the entire four side faces of the joined body from the nozzles 130 as seen in FIG. 14B. It is to be noted that, in FIGS. 14A and 14B, the view on the left side shows the joined body as viewed from above and the view on the right side shows the joined body as viewed from sidewardly. Consequently, the entire side faces of the joined body are coated with an electromagnetic light blocking shield film 30b made of the carbon black 130a. Here, the shield connection portions 16d exposed to the side faces are covered with the electromagnetic light blocking shield film 30b so that they are electrically connected to each other. The camera module 1 shown in FIG. 1 is completed thereby.

Mounting on a Printed Board

In order to mount the camera module 1 produced in such a manner as described above, the camera module 1 and a printed board are joined together with the wafer level package 10 side directed downwardly and with the solder balls 17 and the joining pads on the printed board positioned relative to each other. Then, the electromagnetic light blocking shield films 30a and 30b are connected, for example, to a ground terminal of the printed board so that the electromagnetic light blocking shield films 30a and 30b can be kept at the ground potential.

As described above, in the present embodiment, the electrode pads 13 formed on the front face side of the supporting substrate 14 and the solder balls 17 formed on the rear face side are electrically connected to each other through the through-vias 14a and the re-wiring line layer 16 and external connection terminals are led out from the front face side to the rear face side of the supporting substrate 14. In other words, the external connection terminals are converted from the electrode pads 13 into the solder balls 17. Further, the electromagnetic light blocking shield film 30b is formed by spreading over the overall area of the side face of the camera module 1, that is, of the wafer level package 10. By the electromagnetic light blocking shield film 30b, occurrence of electromagnetic interference, for example, with a mounted printed board or with a different part or the like in a set is suppressed. In other words, in comparison with an alternative case in which a metal sheet or the like is worked to form an electromagnetic shield, the number of steps can be reduced and the cost can be reduced. Therefore, good EMC with a printed board can be maintained at a low cost and by a simple and easy process.

Further, since the electromagnetic light blocking shield film 30b not only has conductivity but also has a light blocking property, invasion of a beam of light from a side face of the module can be prevented. Since usually the side face of the camera module 1 is frequently configured from a transparent material such as the supporting substrate 14, glass substrate 11, lens unit 20 and adhesive layer 21, preferably the electromagnetic light blocking shield film 30b formed on the side face has a light blocking property. Further, formation by spreading is possible, and carbon black is suitably applied as the material having conductivity and a light blocking property.

Further, since the electromagnetic light blocking shield film 30a is provided on the rear face side of the supporting substrate 14, electromagnetic interference with the printed board is suppressed further effectively. In particular, on the rear face side of the supporting substrate 14, the leader wiring line portion 16b interconnecting the pad connecting portion 16a and the solder land 16c is formed as a re-wiring line layer 16, and electric crosstalk sometimes occurs between the leader wiring line portion 16b and a wiring line on the printed board, resulting in failure particularly in correct differential transmission in high speed signal transmission. Further, in the wafer level package 10, solder balls are disposed in a limited region within a chip size, and the wiring line route of the leader wiring line portion 16b of the re-wiring line layer 16 is restricted. Therefore, in order to suppress crosstalk, the wiring line position on the printed board needs to be adjusted. However, there is the possibility that this may give rise to increase of the cost in the case where increase of the number of layers, particularly increase of the number of pins, for keeping the reduced size progresses. However, in the present embodiment, since the electromagnetic light blocking shield film 30a is provided also on the rear face side of the supporting substrate 14, such occurrence of crosstalk as described above can be suppressed.

Further, since such an electromagnetic light blocking shield film 30a as described above has a light blocking property in addition to conductivity, it is possible to prevent light from leaking to the printed board side through the supporting substrate 14.

Modification

FIGS. 15A to 15D illustrate a process of a different method for establishing communication between the re-wiring line layer 16 and the electromagnetic light blocking shield film 30b. In the embodiment described hereinabove, in order to establish communication between the re-wiring line layer 16 and the electromagnetic light blocking shield film 30b, some of the re-wiring line layers 16 are formed so as to be connected to each other between chips positioned adjacent each other and are exposed to side faces of the chips by dicing. In contrast, in the present modification, in order to establish communication between the re-wiring line layer 16 and the electromagnetic light blocking shield film 30b, a through-via is formed also at a corner portion of the supporting substrate 14 of each chip at the through-via formation step, and then some re-wiring line layer portions are formed continuously to the inside of the through-vias at the re-wiring line layer formation step.

In particular, another through-via or second through-hole 14b is first formed on the rear face of the supporting substrate 14 as seen in FIG. 15A simultaneously with the through-vias 14a at the through-via formation step. However, the through-via 14b is disposed at the center of fourth chips which are positioned adjacent each other at respective corner portions thereof, that is, at an intersecting point of dicing lines. Then, at the re-wiring line layer formation step, some re-wiring line layer 16 is formed continuously to the inside of the through-via 14b, for example, at a corner portion of each of the chips as seen in FIG. 15B. The portion of the re-wiring line layer 16 is referred to as shield connection portion 16d1. Thereafter, formation of a sealing resin layer and formation of an electromagnetic light blocking shield film 30a are carried out in a similar manner as in the embodiment described hereinabove. Thereafter, dicing is carried out along a dicing line DL as seen in FIG. 15C. Consequently, the shield connection portion 16d1 is exposed at the four corners of each chip as seen in FIG. 15D. Thereafter, an electromagnetic light blocking shield film 30b is formed by spreading on a side face of the camera module to electrically connect the shield connection portions 16d1 to the electromagnetic light blocking shield film 30b.

Communication between the re-wiring line layer 16 and the electromagnetic light blocking shield film 30b may be established utilizing the through-via 14b as in the present modification.

While the embodiment and the modification of the disclosed technology are described above, the disclosed technology is not limited to the embodiment or the modification. In particular, the configuration of the camera module 1 or the optical module, the procedure regarding the manufacturing method of them and so forth can be modified freely as far as similar effects to those achieved by the embodiment and the modification described above can be achieved.

For example, while, in the embodiment and the modification described above, the electromagnetic light blocking shield films 30a and 30b having conductivity and a light blocking property are described as the first and second electromagnetic shield films in the disclosed technology, respectively, the effects of the disclosed technology can be achieved if they at least have conductivity. Further, it is necessary only to provide, from between the electromagnetic light blocking shield films 30a and 30b, at least the electromagnetic light blocking shield film 30a on the side face side of the camera module 1, while the electromagnetic light blocking shield film 30a on the lower face side of the camera module 1, that is, on the rear face side of the supporting substrate 14, need not necessarily be formed.

Further, while, in the embodiment and the modification described hereinabove, as a manufacturing method of the camera module 1, a lens unit is first laminated to each chip or wafer level package 10 cut out from a sealed body in the form of a wafer, and then the electromagnetic light blocking shield film 30b is formed over the overall area of the side face of the chip. However, if no lens unit is to be provided, then the electromagnetic light blocking shield film may be formed, for example, in the following manner. In particular, after cutting out of each chip, an electromagnetic light blocking shield film may be formed over the overall area of the side face of the chip.

Further, while the embodiment and the modification are described above taking a light reception element as an example of the functioning element in the disclosed technique, the functioning element is not limited to the light reception element but may be a MEMS element or the like. Also in the case where a semiconductor package of a MEMS element is to be mounted on a printed board, if the electromagnetic shield film of the disclosed technology is used, then occurrence of electromagnetic interference with a printed board can be suppressed.

The present disclosure contains subject matter related to that disclosed in Japanese Priority Patent Application JP 2010-200067 filed in the Japan Patent Office on Sep. 7, 2010, the entire content of which is hereby incorporated by reference.

While preferred embodiments of the present disclosure have been described using specific terms, such description is for illustrative purpose only, and it is to be understood that changes and variations may be made without departing from the spirit or scope of the following claims.

What is claimed is:

1. A semiconductor package, comprising:
a supporting substrate;
a functioning element and a first joining element formed on a first principal surface of said supporting substrate;
a sealing substrate disposed in an opposing relationship to said supporting substrate with said functioning element and said first joining element interposed therebetween;
a second joining element provided on a second principal surface of said supporting substrate;
a through-electrode provided in and extending through said supporting substrate and adapted to electrically connect said first and second joining elements; and
a first electromagnetic shield film coated in an overall area of a side face of said supporting substrate which extends perpendicularly to said first and second principal surfaces, wherein
said first electromagnetic shield film has a light blocking property and is made of carbon black.

2. A semiconductor package, comprising:
a supporting substrate;
a functioning element and a first joining element formed on a first principal surface of said supporting substrate;
a sealing substrate disposed in an opposing relationship to said supporting substrate with said functioning element and said first joining element interposed therebetween;
a second joining element provided on a second principal surface of said supporting substrate;
a through-electrode provided in and extending through said supporting substrate and adapted to electrically connect said first and second joining elements;
a first electromagnetic shield film coated in an overall area of a side face of said supporting substrate which extends perpendicularly to said first and second principal surfaces, wherein
said through-electrode has
a through-hole provided in an opposing relationship to said first joining element of said supporting substrate, and
a wiring line layer connected to said first joining element in said through-hole and extending from the inside of said through-hole to a region of said second principal surface in which said second joining element is formed; and
a second electromagnetic shield film provided on said second principal surface of said supporting substrate and having an opening corresponding to said second joining element.

3. The semiconductor package according to claim 2, wherein said wiring line layer is partly exposed to said side face and connected to said first electromagnetic shield film.

4. The semiconductor package according to claim 2, wherein said second electromagnetic shield film has a light blocking property.

5. The semiconductor package according to claim 1, wherein said functioning element is a light reception element.

6. A manufacturing method for a semiconductor package, comprising:
said through-electrode has
a through-hole provided in an opposing relationship to said first joining element of said supporting substrate, and
a wiring line layer connected to said first joining element in said through-hole and extending from the inside of said through-hole to a region of said second principal surface in which said second joining element is formed, wherein
when the first electromagnetic shield film is formed, a material having a light blocking property is used as the conductive material, and
carbon black is used as the conductive material.

7. A manufacturing method for a semiconductor package, comprising:
laminating a sealing substrate to a supporting substrate having a first principal surface on which a functioning element and a first joining element are provided;
forming a through-electrode in a region of the supporting substrate which corresponds to the first joining element;
forming a second joining element electrically connected to the through-electrode on a second principal surface side of the supporting substrate; and spreading a conductive material to an overall area of a side face of the first supporting substrate which extends perpendicularly to the first and second principal surfaces to form a first electromagnetic shield film, wherein when the through-electrode is formed,
- a first through-hole is formed in an opposing relationship to the first joining element in the supporting substrate, and
- a wiring line layer is formed in contact with the first joining element in the first through-hole and formed continuously from the inside of the first through-hole to a region of the second principal surface in which the second joining element is formed, and
- a second electromagnetic shield film is formed on the first principal surface side of the supporting substrate in such a manner as to have an opening corresponding to the second joining element.

8. The manufacturing method for the semiconductor package according to claim 7, wherein a material having a light blocking property is used for the second electromagnetic shield film.

9. The manufacturing method for the semiconductor package according to claim 6, wherein the supporting substrate is a wafer formed from a plurality of chips each including the functioning element,
- the through-electrode and the second joining element are formed on the wafer level, and
- after the second joining element is formed, the first shield film is formed after a dicing step.

10. The manufacturing method for a semiconductor package according to claim 9, wherein, when the through-electrode is formed, the wiring line layer is formed such that some of portions thereof are connected to each other between adjacent ones of the chips thereby to expose part of the wiring line layer to side faces of the chips after diced.

11. The manufacturing method for a semiconductor package according to claim 10, wherein, when the through-electrode is formed,
- a second through-hole is formed in a region of the supporting substrate corresponding to a dicing line, and
- part of the wiring line layer is continuously formed from the first through-hole to the inside of the second through-hole.

12. An optical module, comprising:
- a supporting substrate;
- a light reception element and a first joining element formed on a first principal surface of said supporting substrate;
- a sealing substrate disposed in an opposing relationship to said supporting substrate with said light reception element and said first joining element interposed therebetween;
- a second joining element provided on a second principal surface of said supporting substrate;
- a through-electrode provided in and extending through said supporting substrate and adapted to electrically connect said first and second joining elements;
- a lens unit provided on said sealing substrate; and
- a first electromagnetic shield film coated in an overall area of a side face of said supporting substrate which extends perpendicularly to said first and second principal surfaces, wherein
- said first electromagnetic shield film has a light blocking property and is made of carbon black.

* * * * *